US006465855B1

United States Patent
Jaussaud et al.

(10) Patent No.: US 6,465,855 B1
(45) Date of Patent: Oct. 15, 2002

(54) MICROMACHINED STRUCTURE WITH A DEFORMABLE MEMBRANE AND METHOD FOR MAKING SAME

(75) Inventors: Claude Jaussaud, Meylan; Jean-Frédéric Clerc, Voreipe, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/850,739

(22) PCT Filed: Nov. 26, 1999

(86) PCT No.: PCT/FR99/02936
§ 371 (c)(1),
(2), (4) Date: May 18, 2001

(87) PCT Pub. No.: WO00/33045
PCT Pub. Date: Jun. 8, 2000

(30) Foreign Application Priority Data

Nov. 27, 1998 (FR) .............................................. 98 14969

(51) Int. Cl.[7] .............................................. H01L 29/82
(52) U.S. Cl. ...................................... 257/419; 257/417
(58) Field of Search ......................... 257/419; 73/727; 357/26, 16; 148/33.4

(56) References Cited

U.S. PATENT DOCUMENTS 3,922,705 A   11/1975   Yerman ..................... 357/26
4,706,100 A   11/1987   Tufte ......................... 357/16
5,165,283 A * 11/1992   Kurtz et al. ................. 73/727
5,804,086 A *  9/1998   Bruel .......................... 216/33
6,245,161 B1 * 6/2001   Henley et al. ............. 148/33.4
6,327,911 B1 * 12/2001  Kurtz et al. .................. 73/727

FOREIGN PATENT DOCUMENTS

| DE | 196 01 791 | 7/1997 | |
| FR | 2 681 472 | 3/1993 | |
| JP | 02000046667 A | * 2/2000 | ............. G01L/9/04 |

OTHER PUBLICATIONS

Patent Abstracts of Japan, JP 8-148696, Jun. 7, 1996.
Patent Abstracts of Japan, JP 5-006883, Jan. 14, 1993.

* cited by examiner

Primary Examiner—David Nelms
Assistant Examiner—Thinh Nguyen
(74) Attorney, Agent, or Firm—Oblon, Spivak, McClelland, Maier & Neustadt, P.C.

(57) ABSTRACT

A micromachined structure able to operate at a high temperature, including a deformable membrane secured on a support allowing for its deformation. The membrane includes at least a membrane layer in a material retaining its elasticity for the high operating temperature. The membrane layer supporting components detect the deformation of the membrane, made in a semiconducting material, and it has an electrically insulating interface with the detection components, formed by an electrically insulating layer. The support is made in a material enabling the membrane to be released by a microelectronics technique.

19 Claims, 6 Drawing Sheets

MICROMACHINED STRUCTURE WITH A DEFORMABLE MEMBRANE AND METHOD FOR MAKING SAME

TECHNICAL FIELD

The present invention relates to a micromachined structure with a deformable membrane. It also relates to a method for making such a micromachined structure. In particular, it relates to a micromachined structure for a sensor operating at a high temperature and notably for a pressure sensor.

STATE OF THE PRIOR ART

Microelectronics techniques enable miniature pressure sensors to be made by means of collective manufacturing methods. They therefore provide sensors with reduced dimensions and of a low cost. They allow a sensor and its associated electronics to be made on the same support.

Micromachined pressure sensors consisting of a silicon membrane with a thickness of a few tens of μm are known. The pressure difference between both faces of the membrane may be detected by measuring the stresses upon insertion with piezoresistive gauges obtained by ion diffusion or implantation. These piezoelectric gauges have a high sensitivity and a large mechanical stability due to the single crystal structure of the silicon used. Electrical insulation between each gauge and with the substrate on which they are produced, is achieved through reverse junctions. This has the disadvantage of limiting the operating temperature range of the sensors to a maximum of 125° C. because of the high leak current of the reverse junction and of introducing a high noise level (thermal noise and piezoelectric junction noise) which reduces the dynamic range.

In order to obtain a micromachined structure for pressure sensors operating at a high temperature, several solutions have been investigated.

A first solution consists of a structure including a silicon carbide film (SiC) serving as a deformable membrane and comprising detection components, wherein this SiC film is deposited on a machined silicon support for releasing the membrane. Such a structure has the disadvantage of being limited in temperature by electrical leaks of the junction exhibited by the Si—SiC interface from 200° C. upwards.

A second solution, directly derived from the first, consists of inserting an insulating layer (silicon oxide) between the SiC film and the silicon support. In this case, the micromachined structure includes a membrane consisting of three superimposed layers: the SiC surface film, the oxide intermediate layer and a silicone layer remaining after machining of the silicon support. The presence of this insulating layer provides a structure for which electrical leaks are limited. However, beyond 500° C. the silicon portion of the membrane looses its elastic properties and is deformed.

A third solution consists of making the micromachined structure from a bulk SiC substrate. This solution is both electrically and mechanically suitable. However, the making of the membrane proves to be difficult, as etching of silicon carbide is very difficult. Moreover, this solution is expensive because of the high manufacturing costs of silicon carbide substrates.

U.S. Pat. No. 5,165,283 discloses pressure transducers operating at a high temperature and more particularly transducers using silicon carbide. Silicon carbide is grown on silicon. The obtained material then has a large density of defects which will promote junction leaks and limit its temperature life.

DESCRIPTION OF THE INVENTION

The invention provides a solution to the disadvantages exhibited by the structures of the prior art. It enables a micromachined structure to be made including a membrane which remains elastic even at a high temperature, and the support of which consists of a material which is easy to etch. The support material does not therefore need to have particular elastic properties at high temperatures.

Furthermore, according to the invention, the detection components are not directly made in the membrane layer, so that it is possible to have a membrane layer selected for its elastic functions without any constraint on its electrical properties. Further, the detection components are electrically insulated from the membrane layer, so that electrical leaks from the junction may be prevented.

Accordingly, the object of the invention is a micromachined structure able to operate at a high temperature, including a deformable membrane secured on a support allowing it to be deformed, wherein the membrane comprises at least a membrane layer in a material which retains its elasticity for said high operating temperature, said membrane layer supporting components made in a semiconducting material for detecting the deformation of the membrane, wherein the support is made in a material allowing the membrane to be released by a microelectronics technique, characterized in that the membrane has an electrically insulating interface with detection components, consisting of an electrically insulating layer, and further includes a surface layer in a single crystal semiconducting material in which said detection components are made, said surface layer being a layer transferred onto the electrically insulating layer.

According to a first embodiment, the support is locally, totally or partly etched, in order to release the membrane. According to a second embodiment, the support is obtained by deposition on a matrix, by local etching or by planarization of this coat and removing the matrix. The support may be made in bulk material or not. Notably it may consist of a substrate of the SIC type or a silicon substrate or even a mullite substrate.

According to a preferred embodiment, the membrane layer is in silicon carbide, the detection components are in single crystal silicon carbide and the support is in silicon. In this case, the electrically insulating layer may consist of a silicon oxide layer.

The object of the invention is also a method for making by means of micromachining at least a deformable membrane structure secured on a support and able to operate at a high temperature, characterized it consists of the following steps:

forming, on a face of an initial substrate in a material providing release by means of a microelectronics technique, a membrane layer in a material retaining its elasticity for said high temperature, transferring, on the membrane layer formed on said substrate, a surface layer of a single crystal semiconducting material, with interposition of an electrically insulating layer, making, on the free face of the surface layer, detection components such as piezoresistive gauges to be used as means for detecting the deformation of the membrane, making electrical contacts on said free face for connecting the detection components to electrical connection means, releasing the membrane from said structure The release of the membrane of a structure may be made by removing material from the other face of the substrate. This may also be done by removing a matrix with a complementary surface to the micromachined structure.

In the case of a collective manufacturing method, this method also includes a final cutting step for obtaining separate structures.

Formation of the membrane layer may be accomplished by deposition.

According a first alternative, the transfer of said surface layer of semiconducting material is obtained from a wafer of the same material wherein this surface layer has been defined by a layer of microcavities generated by ion implantation, said wafer being stuck on the membrane layer formed on the initial substrate, then being cleaved at the microcavity layer in order to only retain the surface layer on the membrane layer. According to a second alternative, the transfer of said surface layer of a semiconducting material is obtained from a wafer comprising a layer of the same material secured on a support substrate, the surface layer being defined in said layer of the same material by a microcavity layer generated by ion implantation, said wafer being stuck on the membrane layer formed on the initial substrate, then cleaved at the micro cavity layer in order to only retain the surface layer on the membrane layer. Cleavage of the wafer may be obtained through coalescence of microcavities resulting from a heat treatment. The thickness of the transferred surface layer may be completed and monitored by epitaxy of the same material making up this surface layer.

According to a third embodiment, the transfer of said surface layer of semiconducting material is obtained from a wafer comprising said surface layer secured on a support substrate said wafer being stuck on the membrane layer formed on the initial substrate, the substrate supporting the wafer then being removed in order to only retain the surface layer on the membrane layer. This removal of the support substrate may be performed by a method selected from chemical dissolution and etching.

Advantageously, for the three alternative methods, the sticking of the wafer on the membrane layer is obtained by molecular adhesion.

The electrically insulating layer interposed between the surface layer and the membrane layer may consist of a first electrically insulating layer formed on the surface layer and of a second electrically insulating layer formed on the membrane layer, wherein said first and second electrically insulating layers are selected in order to contribute to the sticking by molecular adhesion.

If the detection components are piezoresistive gauges, the latter may be made by a method selected form ion implantation and ion diffusion. The electrical contacts may be made by depositing a metal layer on the free face of the surface layer and by etching this metal layer.

Preferably, said removal of material is obtained by a method selected from mechanical machining and chemical etching.

SHORT DESCRIPTION OF THE DRAWINGS

The invention will be better understood and other advantages and features will become apparent on reading the description which follows, given as a non-limiting example, accompanied by appended drawings wherein.

DETAILED DESCRIPTION OF THE INVENTION

FIGS. 1A–1F are sectional views which illustrate a first alternative embodiment of micromachined structures according to the invention. For the sake of simplification, the making of a single structure is illustrated.

Figure 1A:
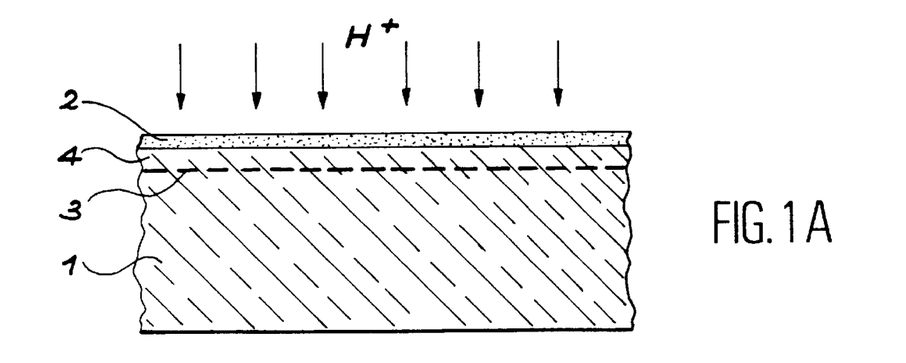
FIGS. 1A–1F illustrate a first embodiment of the method for manufacturing micromachined structures with a deformable membrane according to the present invention.

FIG. 1A shows a wafer 1 in semiconducting material, for example single crystal silicium carbide. A silicon oxide layer 2 with a thickness of the order of 500 nm was deposited on wafer 1.

Figure 1B:
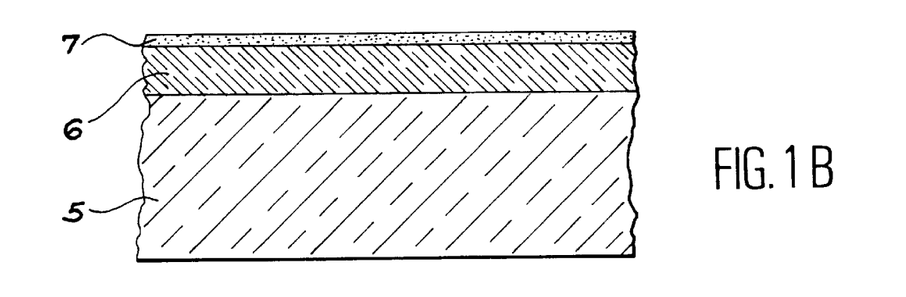

FIG. 1B shows a substrate 5 in a material which may be easily machined by means of a microelectronics technique, for example a silicon substrate. A layer 6, for example a 5 $\mu$m thick single crystal silicon carbide layer is deposited on substrate 5. Layer 6 is for forming the membrane layer of the structure. A silicon oxide layer 7 is formed on layer 6 by thermal oxidation or by deposition. The thickness of layer 6 is of the order of 500 nm.

Now it s a matter of transferring a surface layer of material from wafer 1 onto substrate 5, in such a way that the oxide layers 2 and 7 are in close contact. According to this first alternative method, the transfer is achieved by the transfer method disclosed by the application FR-A-2 681 472. According to this transfer method, wafer 1 is bombarded through the oxide layer 2 by ions (for example hydrogen ions) in order to generate within the wafer a layer of microcavities 3 parallel to the bombarded face (see FIG. 1A). The layer of microcavities 3 is located at a depth matching the thickness of the layer 4 which is to be transferred.

Figure 1C:
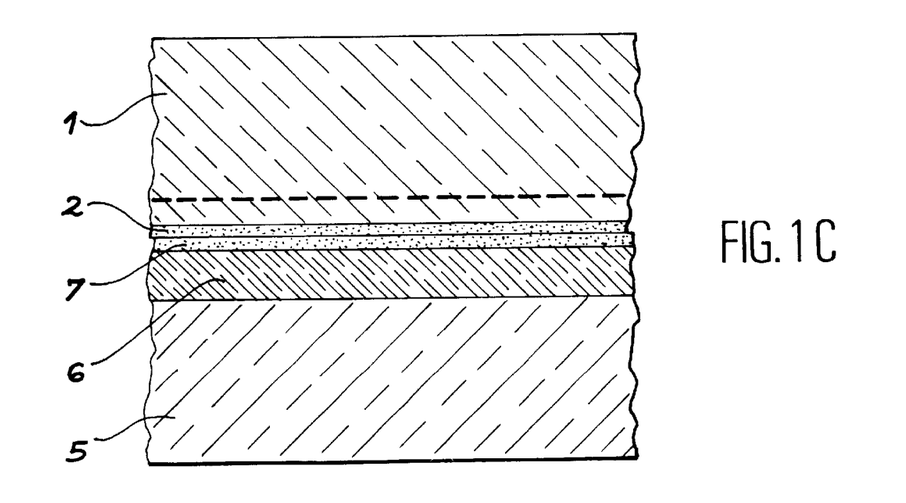

Wafer 1 is then stuck on the substrate 5 by putting their oxide layers 2 and 7 in close contact. The sticking may advantageously be achieved by the molecular adhesion technique. The assembly illustrated in FIG. 1C is obtained.

Figure 1D:
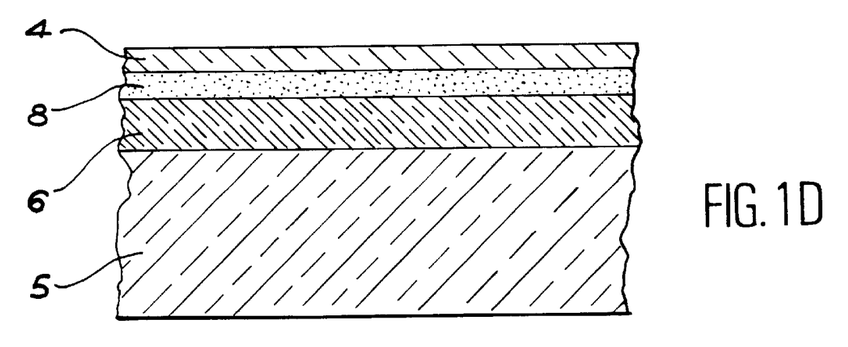
Figure 1E:
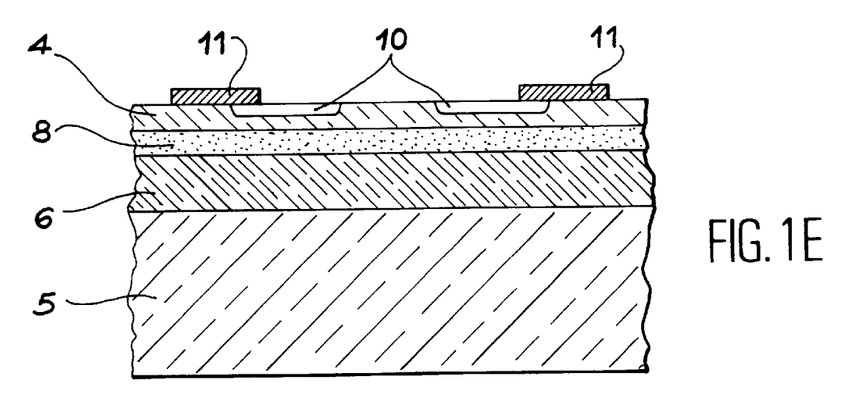
Figure 1F:
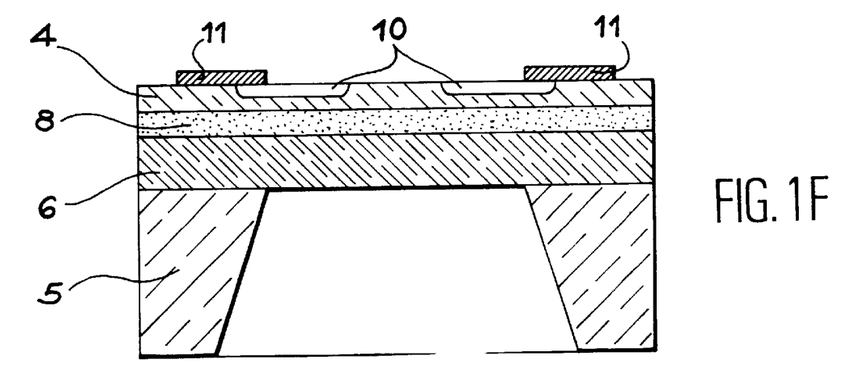

By means of a suitable heat treatment optionally assisted by applying mechanical forces, coalescence of microcavities and cleavage of the wafer are caused along the microcavity layer. A surface layer 4 adhering to substrate 5 and separated from the rest of the wafer which is reusable is then obtained, as seen in FIG. 1D. In FIG. 1D, the oxide layers joined through sticking are designated under the unique reference number 8.

The presence of an insulating layer, for example in silicon oxide $SiO_2$, is advantageous as compared with insulation through a junction. Oxide insulation provides more strength at higher temperatures than a junction. Further, electronic noise is lower in the case of a dielectric insulation than in the case of a junction insulation. The free face of the surface layer 4 may receive a coating by epitaxy of the same material as that forming this layer. This enables the thickness of the layer to be completed and finely monitored.

The single crystal SiC layer 4 is particularly of interest because this material has a higher piezoelectric coefficient as polycrystalline SiC. It is more reproducible (no problems related to grain size or grain boundaries) and it has better mechanical stability especially under stress.

As seen in FIG. 1A, the detection components such as the piezoresistive gauges 10, are then formed at locations of the surface layer 4 determined according to the shape of the future membrane. These piezoresistive gauges are made through a method known to one skilled in the art, for example by ion implantation or diffusion.

A conducting layer is then deposited on the surface layer 4, and then etched in order to form electrical contacts 11 with the piezoresistive gauges 10.

In this example, substrate 5 is then machined from its rear face until the membrane layer 6 is reached, in order to form for each structure, a circular membrane joined to a peripheral portion. A transverse cut of the final substrate enables the structures to be separated (see FIG. 1F).

Figure 2A:
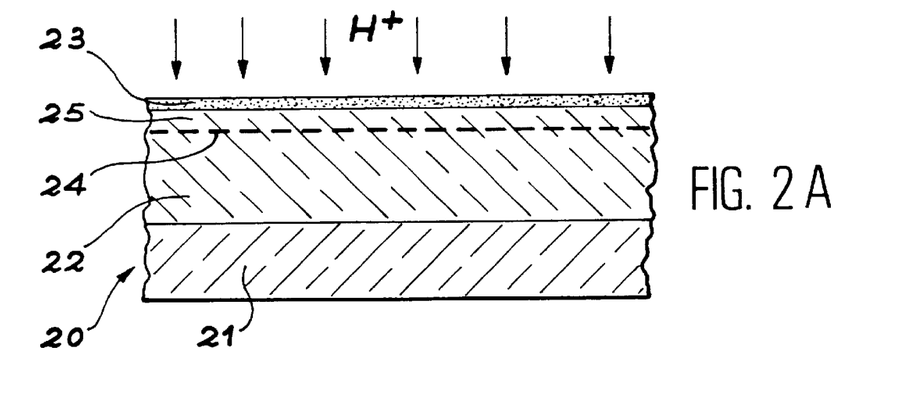
FIGS. 2A–2C illustrate a second embodiment of the method for manufacturing the micromachined structures with a deformable membrane according to the present invention.
Figure 2B:
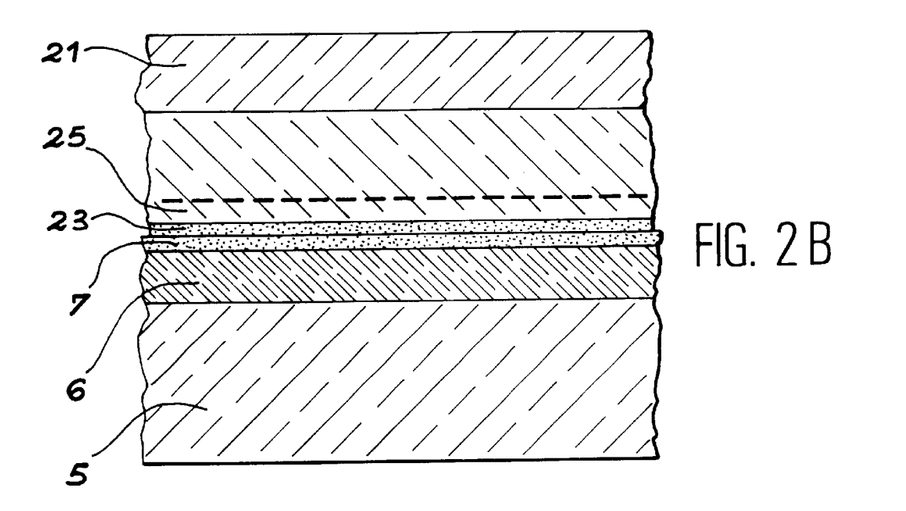
Figure 2C:
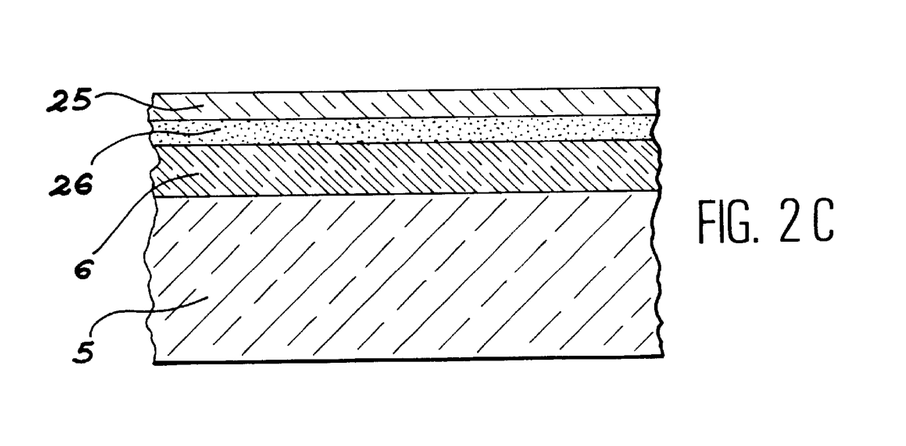

FIGS. 2A–2C are sectional views which illustrate a second alternative embodiment of the micromachined structures according to the invention. For the same reason as earlier, the making of a single structure is illustrated.

The difference between this alternative and the previous one lies in the constitution of the wafer which will provide the semiconducting material surface layer.

As seen in FIG. 2A, the wafer 20 comprises a support substrate 21 on which is fixed a block 22 of a material matching the surface layer. The support substrate 21 is for example in silicon and the block 22 in single crystal silicon carbide. This provides the advantage of not having to use the bulk silicon carbide substrate.

A silicon oxide layer 23 with a thickness of the order of 500 nm was deposited on the wafer 20.

As before, a layer of microcavities 24 generated through ion implantation defines the thickness of the surface layer 25 which is to be transferred.

The membrane layer is formed in the same way as for the first embodiment, as illustrated in FIG. 1B.

FIG. 2B shows the assembly resulting from the sticking of the wafer 20 on substrate 5.

Through a suitable heat treatment, coalescence of the microcavities and cleavage of the wafer are caused along the layer of microcavities. As shown in FIG. 2C, a surface layer 25 adhering to substrate 5 is then obtained and separated from the remainder on the wafer which is reusable. In FIG. 2C, the oxide layers joined through sticking are designated under the unique reference number 26.

The following steps of this alternative method are identical to those of the first alternative method described.

Figure 3A:
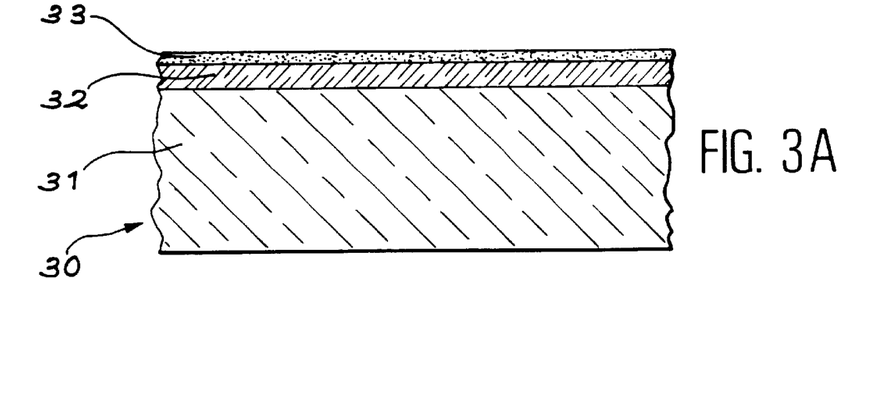
FIGS. 3A–3C illustrate a third alternative method for manufacturing the micromachined structure with a deformable membrane according to the present invention.
Figure 3B:
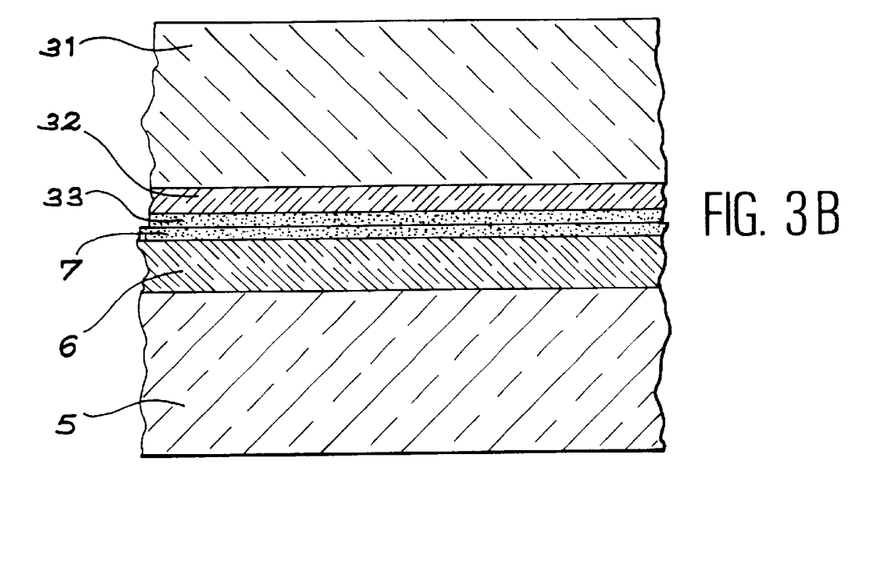
Figure 3C:
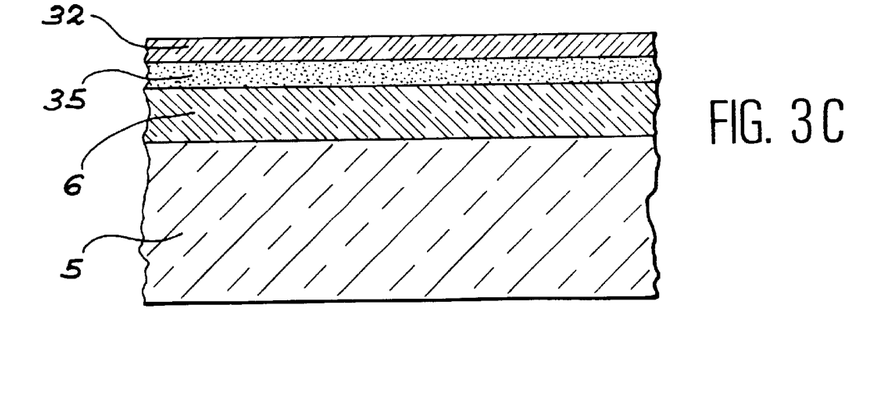

FIGS. 3A–3C are sectional views which illustrate a third embodiment of the micromachined structures according to the invention. For the same reason as earlier, the making of a single structure is illustrated.

The difference between this third alternative and the previous ones also lies in the constitution of the wafer which will provide the surface layer of a single crystal semiconducting material.

As seen in FIG. 3A, wafer 30 comprises a support substrate 31 on which is directly fixed the surface layer 32 to be transferred. The support substrate 31 is for example in silicon and the surface layer 32 in single crystal silicon carbide.

A silicon oxide layer 33 of a thickness of the order of 500 nm was formed on the wafer 30 by thermal deposition or oxidation.

The membrane layer is formed in the same way as for the first embodiment, as illustrated in FIG. 1B.

FIG. 3B shows the assembly resulting from the sticking of wafer 30 on substrate 5.

The support substrate 31 is then removed by means of chemical dissolution or etching. A surface layer 32 adhering to the substrate 5 is then obtained as is shown in FIG. 3C. In FIG. 3C, the oxide layers joined together by sticking are designated under the unique reference number 35.

The following steps of this third alternative method are identical to those of the first alternative method described.

FIGS. 4A–4F are sectional views which illustrate a fourth alternative embodiment of the micromachined structure according to the invention. For the same reason as earlier, the making of a single sensitive component is illustrated.

Figure 4A:
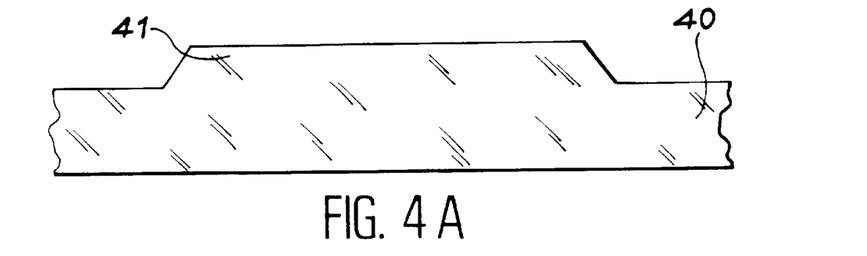
FIGS. 4A–4F illustrate an fourth alternative method for manufacturing micromachined structure with a deformable membrane according to the present invention.
Figure 4B:
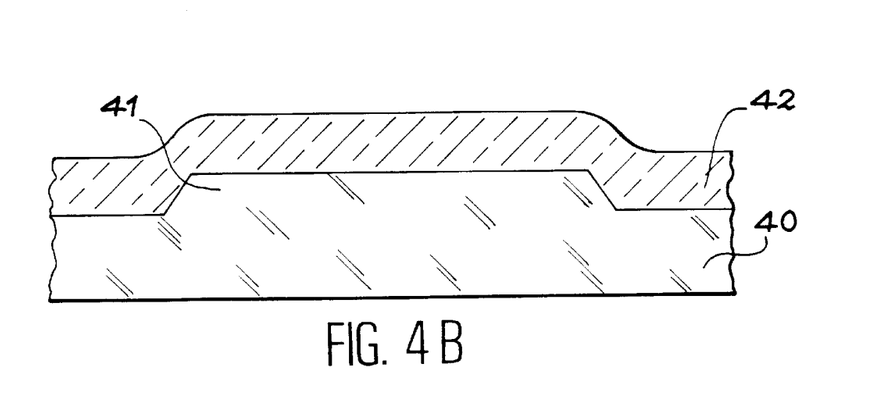

FIG. 4A shows a substrate 40, for example in silicon, which has been machined, for example by chemical etching, in order to provide its upper face with bosses 41 of a tapered shape. The making of a sensitive component corresponds to each boss 41. In particular, etching may be applied which uses bases (for example KOH) which enables cavities with edges orientated along (111) planes at 54° to be obtained from a silicon substrate with (100) orientation.

A polycrystalline silicon carbide layer 42 which follows the bumpy surface of substrate 40 (see FIG. 4B) is then deposited on the upper face of substrate 40 which serves as a matrix. Layer 42 may be deposited by a CVD technique.

Figure 4C:
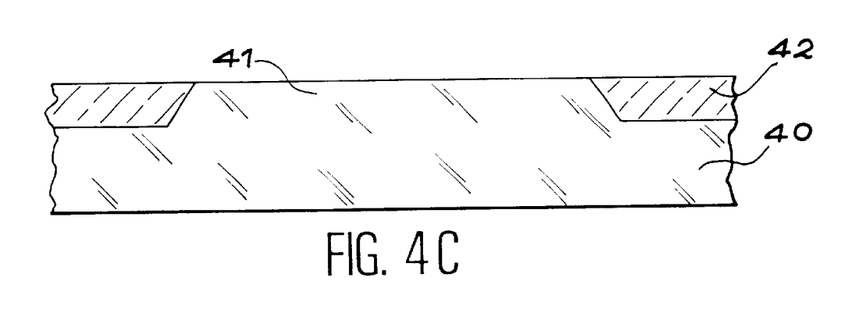

The thereby covered substrate is then levelled, for example by mechanical and chemical polishing, in order to obtain the structure illustrated in FIG. 4C. Each boss top is exposed and each boss 41 is surrounded by polycrystalline silicon carbide 42.

A first single crystal silicon carbide layer 43 is then transferred onto the leveled substrate. A second single crystal silicon carbide layer 44 is deposited by epitaxy on the first layer 43. Layers 43 and 44 form the single crystal silicon carbide layer 45 (see FIG. 4D). The epitaxy layer 44 enables the thickness of the membrane to be monitored. A silicon oxide layer 46 may optionally be deposited on layer 45.

Figure 4D:
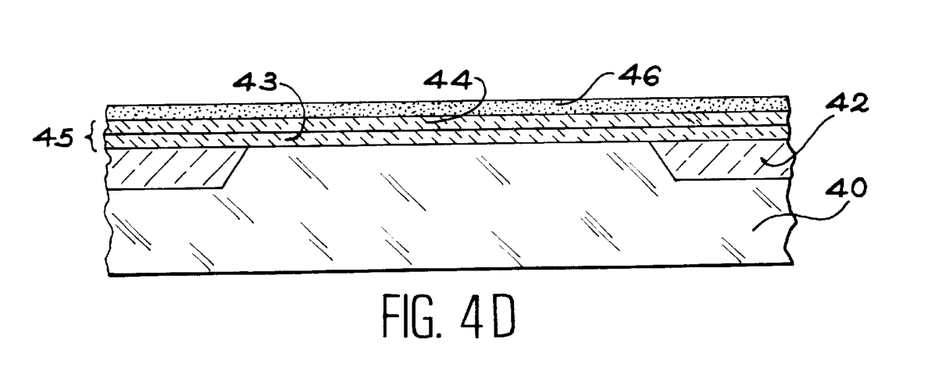
Figure 4E:
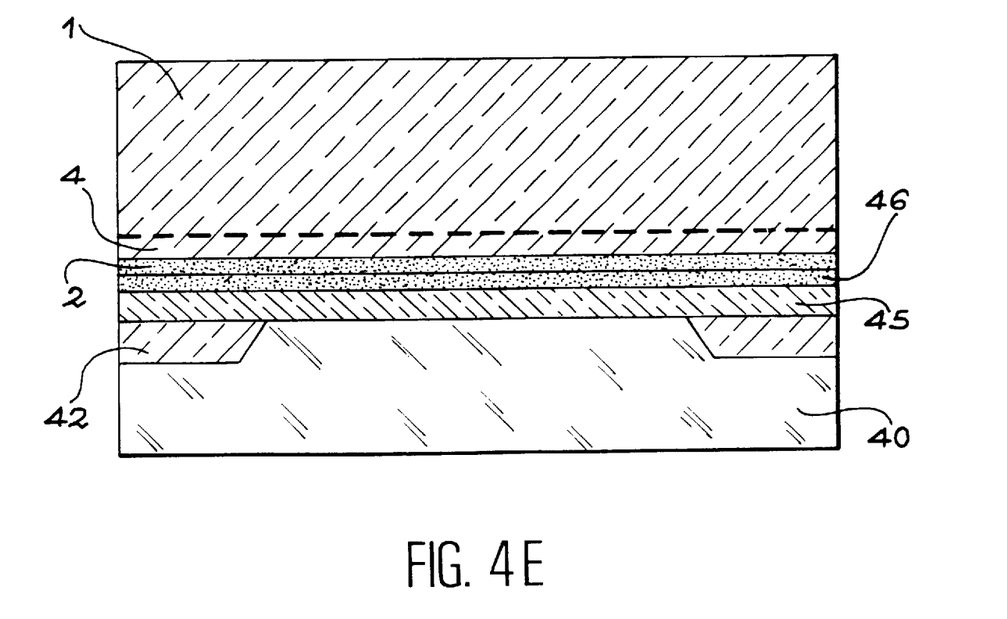

The structure illustrated in FIG. 4D is then stuck on wafer 1, which was treated in the way illustrated in FIG. 1A, by putting their oxide layers 46 and 2 (see FIG. 4E) in close contact.

Figure 4F:
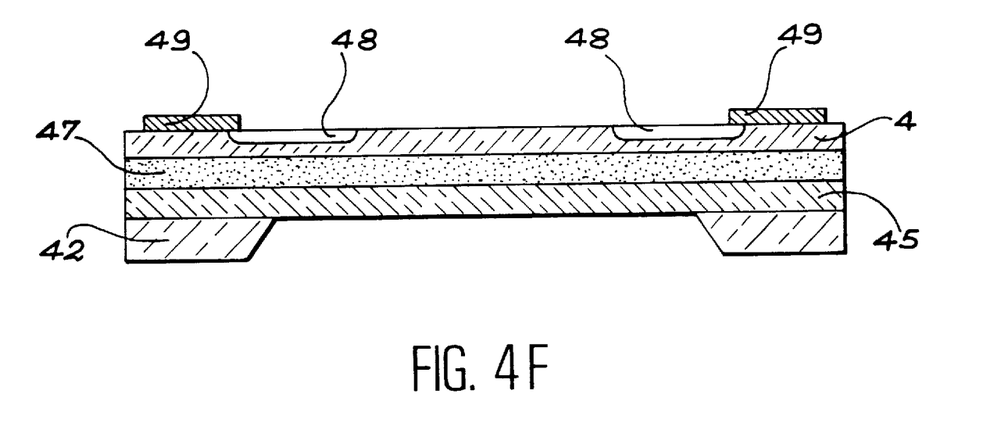

Through a suitable heat treatment optionally assisted by applying mechanical forces, coalescence of the microcavities and cleavage of wafer 1 are caused along the microcavity layer. The sequence of operations is analogous to those described in conjunction with FIGS. 1D and 1E. Finally, the substrate 40 is removed, for example by chemical etching. The micromachined structure is then obtained as illustrated in FIG. 4F where the oxide layers joined together by sticking are designated under the unique reference number 47. This figure also shows the detection components 48, for example piezoresistive gauges, formed in the silicon carbide surface layer 4, and their electrical contacts 49.

What is claimed is:

1. A micromachined structure able to operate at a high temperature, including a deformable membrane secured on a support allowing its deformation, wherein the membrane comprises at least a membrane layer in a material retaining its elasticity for said high operating temperature, said membrane layer supporting components for detecting deformation of the membrane, made in semiconducting material, wherein the support is made in a material able to release the membrane through a microelectronics technique, wherein the membrane has an electrically insulating interface with the detection components comprising an electrically insulating layer and further includes a surface layer of a single crystal semiconducting material in which are made said detection components, wherein said surface layer is a transferred layer on the electrically insulating layer.

2. The micromachined structure according to claim 1, wherein the membrane layer is in silicon carbide, the detection components are in single crystal silicon carbide, and the support is in silicon.

3. The micromachined structure according to claim 2, wherein the electrically insulating layer includes a silicon oxide layer.

4. A method for making by means of micro-machining at least a structure with a deformable membrane secured on a support and able to operate at a high temperature, including the following steps:

forming, on a face of an initial substrate in a material providing release by means of a microelectronics technique, a membrane layer in a material retaining its elasticity for said high temperature, transferring, on the membrane layer formed on said substrate, a surface layer of a single crystal semiconducting material, with interposition of an electrically insulating layer, making, on the free face of the surface layer, detection components to be used as means for detecting deformation of the membrane, making electrical contacts on said free face for connecting the detection components to electrical connection means, releasing the membrane from said structure.

5. The method according to claim 4, wherein the release of the membrane from said structure is obtained by removal of material from the other side of the substrate.

6. The method according to claim 4, wherein the release of the membrane of said structure is obtained by removal of a matrix of a complementary shape to the micromachined structure.

7. The method according to claim 4, wherein the method is a collective manufacturing method for micromachined structures, and includes a final cutting step in order to obtain separate structures.

8. The method according to claim 4, wherein the formation of the membrane layer on the initial substrate is accomplished by deposition.

9. The method according to claim 4, wherein the transfer of said surface layer of semiconducting material is obtained from a wafer of the same material in which the surface layer was defined by a layer of microcavities generated by ion implantation, wherein said wafer is stuck on the membrane layer formed on the initial substrate, then cleaved at the microcavity layer in order to only retain the surface layer on the membrane layer.

10. The method according to claim 5, wherein the transfer of said surface layer of semiconducting material is obtained from a wafer comprising a layer of the same material secured on a support substrate, wherein the surface layer is defined in said layer of the same material by a layer of microcavities generated by ion implantation, wherein said wafer is stuck on the membrane layer formed on the initial substrate, then cleaved at the microcavity layer in order to only retain the surface layer on the membrane layer.

11. The method according to claim 9, wherein the cleavage of wafer is obtained by coalescence of microcavities resulting from a heat treatment.

12. The method according to claim 9, wherein a thickness of said transferred surface layer is completed and monitored by epitaxy of the same material making up the surface layer.

13. The method according to claim 4, wherein the transfer of said surface layer of semiconducting material is obtained from a wafer comprising said surface layer secured on a support substrate, wherein said wafer is stuck on the membrane layer formed on the initial substrate, and wherein the support substrate of wafer is then removed in order to only retain the surface layer on the membrane layer.

14. The method according to claim 13, wherein said removal of the support substrate is achieved by a method selected from chemical dissolution and etching.

15. The method according to claim 9, wherein the sticking of the wafer on the membrane layer is obtained by molecular adhesion.

16. The method according to claim 15, wherein the electrically insulating layer interposed between the surface layer and the membrane layer includes a first electrically insulating layer formed on the surface layer and a second electrically insulating layer formed on the membrane layer, wherein said first and second electrically insulating layers are selected in order to contribute to the sticking by molecular adhesion.

17. The method according to claim 4, wherein the detection components are piezoresistive gauges and are made by means of a method selected from ion implantation and ion diffusion.

18. The method according to claim 4, wherein said electrical contacts are made by depositing a metal layer on a free surface of the surface layer and by etching the metal layer.

19. The method according to claim 5, wherein said removal of material is obtained by a method selected from mechanical machining and chemical etching.

* * * * *